(12) United States Patent
Ryu et al.

(10) Patent No.: US 12,106,795 B2
(45) Date of Patent: Oct. 1, 2024

(54) MEMORY DEVICE HAVING SUB WORDLINE DRIVER

(71) Applicant: Samsung Electronics Co., Ltd., Suwon-si (KR)

(72) Inventors: Myeongsik Ryu, Anyang-si (KR); Bokyeon Won, Namyangju-si (KR); Kyoungmin Kim, Namyangju-si (KR); Donggeon Kim, Suwon-si (KR); Sangwook Park, Hwaseong-si (KR); Inseok Baek, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 308 days.

(21) Appl. No.: 17/724,006

(22) Filed: Apr. 19, 2022

(65) Prior Publication Data

US 2023/0122198 A1    Apr. 20, 2023

(30) Foreign Application Priority Data

Oct. 19, 2021    (KR) .................. 10-2021-0139453

(51) Int. Cl.
*G11C 11/408*    (2006.01)
(52) U.S. Cl.
CPC ............................... *G11C 11/4085* (2013.01)
(58) Field of Classification Search
CPC ............ G11C 11/4085; G11C 11/4023; G11C 11/4074; G11C 5/025; G11C 8/14; G11C 5/063; H10B 12/50; H10B 12/488
See application file for complete search history.

(56) References Cited

U.S. PATENT DOCUMENTS

| 7,751,273 | B2 | 7/2010 | Yang |
| 9,111,633 | B2 | 8/2015 | Kim |
| 9,318,175 | B1 * | 4/2016 | Chi ........................ G11C 8/08 |
| 9,437,265 | B2 | 9/2016 | Iwasa et al. |
| 9,543,306 | B1 | 1/2017 | Lee |
| 9,583,152 | B1 | 2/2017 | Jeong |
| 10,008,256 | B1 * | 6/2018 | Kim ................... G11C 11/4085 |

(Continued)

FOREIGN PATENT DOCUMENTS

KR    10-2021-0008882 A    1/2021

OTHER PUBLICATIONS

Taiwan Office Action dated May 8, 2023 issued in corresponding Taiwan Patent Application No. TW 111120870.

*Primary Examiner* — Allison Bernstein
(74) *Attorney, Agent, or Firm* — Harness, Dickey & Pierce, P.L.C.

(57) ABSTRACT

A memory device includes a first sub wordline driver including a first active region connected to a first wordline through a first direct contact, and a first transistor connected to a first gate line, the first gate line and the first wordline extending in a first direction, and a second sub wordline driver including a second active region connected to a second wordline through a second direct, the second direct contact and first direct contact extending in parallel in a second direction, the second direction being perpendicular to the first direction. A second transistor is connected to a second gate line. The second gate line extends in the first direction. A third wordline driven by a third sub wordline driver is between the first wordline and the second wordline.

20 Claims, 13 Drawing Sheets

(56) References Cited

U.S. PATENT DOCUMENTS

| | | |
|---|---|---|
| 10,490,256 B2 | 11/2019 | Jeong |
| 2013/0155801 A1 | 6/2013 | Yun et al. |
| 2016/0163708 A1 | 6/2016 | Jang et al. |
| 2023/0026502 A1* | 1/2023 | Wang ...................... G11C 8/14 |

\* cited by examiner

FIG. 2

MEMORY DEVICE HAVING SUB WORDLINE DRIVER

CROSS-REFERENCE TO RELATED APPLICATION(S)

This application claims the benefit under 35 USC 119(a) of Korean Patent Application No. 10-2021-0139453 filed on Oct. 19, 2021 in the Korean Intellectual Property Office, the disclosure of which is incorporated herein by reference in its entirety.

BACKGROUND

The present inventive concepts relate to a sub wordline driver and a memory device including the same.

Memory devices, in detail, dynamic random access memories (DRAMs), volatile memory devices, in which stored data is lost when the power supply is cut off, include a plurality of memory cells arranged in matrix form. As the DRAM manufacturing process is miniaturized, the number of memory cells connected to one wordline is increasing, and the spacing between the wordlines is also decreasing. Therefore, to prevent a speed delay problem occurring when the wordline voltage applied to the wordline is provided to a relatively large number of memory cells, a method of driving wordlines with a sub wordline driver (SWD) is used.

SUMMARY

Example embodiments provide a memory device in which the operational reliability of a sub wordline driver may be improved by changing the layout of the sub wordline driver to significantly reduce the gap between direct contacts.

According to example embodiments, a memory device includes a first sub wordline driver including a first active region connected to a first wordline through a first direct contact, and a first transistor connected to a first gate line, the first gate line and the first wordline extending in a first direction; and a second sub wordline driver including a second active region connected to a second wordline through a second direct contact, the second direct contact and first direct contact extending in parallel in a second direction, the second direction being perpendicular to the first direction and a second transistor connected to a second gate line, the second gate line extending in the first direction. A third wordline driven by a third sub wordline driver is between the first wordline and the second wordline.

According to example embodiments, a first sub wordline driver includes a first wordline between a first active region connected to a first direct contact and a second direct contact connected to a second active region separated from the first active region and the first direct contact, a first direction being perpendicular to a second direction, the second direct contact constituting a second sub wordline driver adjacent in the second direction, the adjacent transistor configured activate a second wordline, and activate a third wordline connected to the first active region through the first direct contact, in response to a wordline enable signal applied to a gate line extending in the first direction.

According to example embodiments, a memory device includes a memory cell array including a plurality of sub cell arrays; and a plurality of sub wordline driver groups each including a plurality of sub wordline drivers corresponding to the plurality of sub cell arrays, respectively, and driving a plurality of wordlines connected to the corresponding sub cell arrays. Each of the plurality of sub wordline drivers included in each of the plurality of sub wordline driver groups includes a plurality of gate lines extending in a first direction, and a plurality of transistors implemented by a plurality of active regions adjacent to the plurality of gate lines, the plurality of wordlines extending in the first direction and the plurality of transistors include a first transistor and a second transistor with respective active regions of the first transistor and the second transistor connected to a first driving wordline and a second driving wordline, respectively, through a direct contact, and one wordline of the plurality of wordlines other than the first driving wordline and the second driving wordline, the first transistor and the second transistor being positioned side by side in a second direction perpendicular to the first direction, the one wordline being between the first driving wordline and the second driving wordline.

BRIEF DESCRIPTION OF DRAWINGS

The above and other aspects, features, and advantages of the present inventive concepts will be more clearly understood from the following detailed description, taken in conjunction with the accompanying drawings, in which:

FIG. 2 is a diagram schematically illustrating a layout of a memory device according to an example embodiment;

DETAILED DESCRIPTION

Hereinafter, example embodiments will be described with reference to the accompanying drawings.

Figure 1:
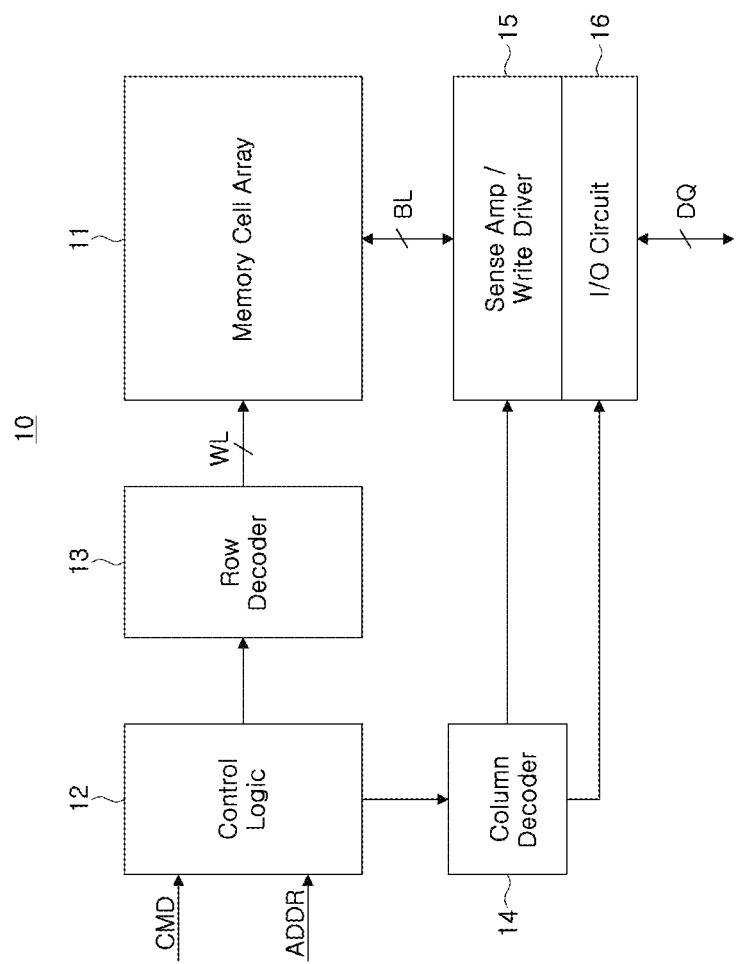
FIG. 1 is a schematic block diagram illustrating a memory device according to an example embodiment.

FIG. 1 is a schematic block diagram illustrating a memory device according to an example embodiment.

A Memory device 10, according to an example embodiment, may be a dynamic random access memory (DRAM) such as a Double Data Rate Synchronous Dynamic Random Access Memory (DDR SDRAM), Low Power Double Data Rate SDRAM (LPDDR SDRAM), Graphics Double Data Rate SDRAM (GDDR SDRAM), Rambus DRAM (RDRAM), or the like. However, this is only an example embodiment, and the type of the memory device 10 may not be limited to any one thereof.

The memory device 10 may store data received by a data signal DQ or output data as the data signal DQ in response to an address signal ADDR and a control command signal CMD received from an external host (e.g., a central processing unit (CPU), an application processor (AP), a system on a chip (SoC)).

Referring to FIG. 1, the memory device 10, according to an example embodiment, may include a memory cell array 11, a control logic 12, a row decoder 13, a column decoder 14, a sense amplifier/write driver 15, and an input/output circuit 16.

The memory cell array 11 may include a plurality of memory cells. The plurality of memory cells may be connected to the row decoder 13 and the sense amplifier/write driver 15 through a plurality of wordlines WL and a plurality of bitlines BL. The plurality of memory cells may be respectively located at points at which the plurality of wordlines WL and the plurality of bitlines BL intersect each other. The plurality of memory cells may be disposed in a matrix form in the memory cell array 11, and each of the plurality of memory cells may include at least one memory device storing data. For example, when the memory device 10 is a DRAM, each of the plurality of memory cells may include a cell transistor and a cell capacitor, serving as a switch.

The control logic 12 may receive the address signal ADDR and the control command signal CMD from the external host. The address signal ADDR may include a row address indicating a row in the memory cell array 11 and a column address indicating a column in the memory cell array 11. For example, the row decoder 13 may select at least one of the plurality of wordlines WL with reference to the row address, and the column decoder 14 may select at least one of the plurality of bitlines BL with reference to the column address.

The sense amplifier 15 may sense and amplify data of a memory cell connected to a selected bitline BL. The sense amplifier 15 may output data read from the memory cell to the outside thereof through the input/output circuit 16. On the other hand, the write driver 15 may receive write data applied from the outside through the input/output circuit 16 and store the received data in the selected memory cell.

In the memory device 10 according to an example embodiment, the row decoder 13 may decode a row address input from the outside. The row decoder 13 may select at least one of the plurality of wordlines WL in response to a row address. The row decoder 13 may activate a selected wordline WL using a wordline enable signal.

Due to increases in the size of data stored in memory devices such as the memory device 10, the memory device 10 may have a relatively higher degree of integration. To improve the degree of integration of the memory device 10 and increase the storage capacity, the number of memory cells included in the memory device 10 may be increased. A set of memory cells included in the memory device 10 forms the memory cell array 11, and as the number of memory cells increases, the size of the memory cell array 11 may increase.

To distribute the loading applied to the wordline as the number of memory cells increases, the plurality of wordlines WL may be divided into sub wordlines and controlled. For example, the plurality of wordlines WL may be comprised of a plurality of sub wordlines. For example, the plurality of sub wordlines may be grouped into a plurality of sub wordline groups, and each of the sub wordline groups may be connected to one main wordline.

Accordingly, the row decoder 13 may include a sub wordline driver for individually controlling the sub wordlines. Hereinafter, sub wordlines may be referred to as wordlines in this specification. The sub wordline driver may drive at least one of the plurality of wordlines WL in response to a wordline enable signal and a driving signal generated from other components of the row decoder 13.

The sub wordline driver may be comprised of a plurality of transistors. Since the sub wordline driver corresponds to each of the plurality of wordlines WL, a layout design thereof may be determined according to the arrangement of the plurality of wordlines WL. On the other hand, as the semiconductor process is miniaturized, it may be difficult to secure a margin on the layout of the plurality of transistors included in the sub wordline driver.

In the sub wordline driver and the semiconductor device 10 according to an example embodiment, a margin may be secured by changing a layout design between a plurality of wordlines WL and a plurality of transistors included in the sub wordline driver, and, the operation reliability of the sub wordline driver may be improved.

Figure 3:
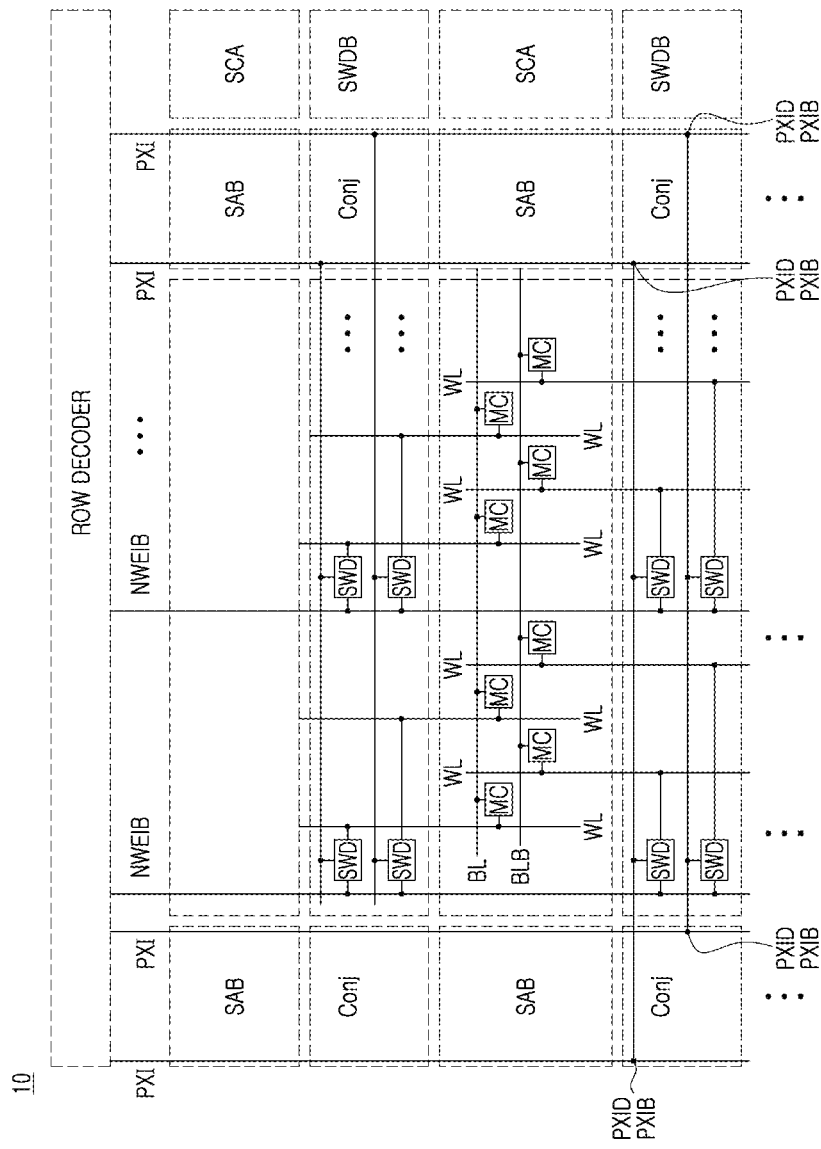
FIG. 3 is a diagram illustrating a layout of a memory device according to an example embodiment.

FIG. 2 is a diagram schematically illustrating a layout of a memory device according to an example embodiment. FIG. 3 is a diagram to describe a layout of a memory device according to an example embodiment.

Referring to FIG. 2, a memory device 10, according to an example embodiment, may include a plurality of sub-cell arrays SCA in which memory cells are respectively disposed, a plurality of sub wordline driver blocks SWDB, a plurality of sense amplification blocks SAB, and a plurality of connection circuit blocks Conj.

A plurality of sub wordline driver blocks SWDB may be disposed between the plurality of sub cell arrays SCA in one direction, and the plurality of sense amplification blocks SAB may be disposed between the plurality of sub cell arrays SCA in another direction. The plurality of connection circuit blocks Conj may be disposed between the plurality of sub wordline blocks SWDB and the plurality of sense amplification blocks SAB.

Referring to FIGS. 2 and 3 together, in each of the plurality of sub-cell arrays SCA, the memory cells MC may be connected to at least one of the plurality of wordlines WL, and at least one of the bitlines BL and complementary bitlines BLB. For example, in each of the plurality of sub-cell arrays SCA, memory cells MC may be disposed at intersections of the sub-wordlines WL and the bitlines BL/BLB.

Each of the sub wordline driver blocks SWDB may include a plurality of sub wordline drivers SWD for driving the corresponding wordline WL. The sub wordline drivers SWD may be respectively connected to the plurality of wordlines WL connected to the memory cells MC. For example, when the wordline WL is driven by one of the sub wordline drivers SWD and the bitlines BL and BLB are selected, one corresponding memory cell among the memory cells MC may be accessed.

Since a plurality of memory cells MC corresponding to one page are connected to one main wordline, the loading of the main wordline may increase as the number of memory cells increases. The loading of the main wordline tends to increase according to the miniaturization of the process, and to distribute the loading of the main wordline, the plurality of sub wordline drivers SWD that access the memory cells MC using the sub wordline WL may be disposed distributedly.

The plurality of sub wordline drivers SWD may activate the selected wordline in response to a wordline enable signal NWEIB and driving signals PXID and PXIB output from the row decoder. The wordline enable signal NWEIB and the driving signals PXID and PXIB may be controlled based on an address signal for determining the selected wordline WL.

Each of the plurality of sense amplification blocks SAB may include a plurality of sense amplifiers. For example, the plurality of sense amplifiers may correspond to the sense amplifier 15 illustrated in FIG. 1.

Each of the connection circuit blocks Conj may include a plurality of wordline driving signal generating circuits. The plurality of wordline driving signal generating circuits may apply a high voltage (higher than the power supply voltage) to the selected wordlines, for example, apply a boosted voltage VPP thereto, and may apply a low voltage lower than a ground voltage, for example a back bias voltage VBB, to unselected wordlines. However, this is only an example and the present inventive concepts may not be limited thereto.

The plurality of wordline driving signal generating circuits may output complementary driving signals PXID and PXIB for driving the plurality of sub wordline drivers SWD based on a signal applied from the row decoder. The driving signals PXID and PXIB may include a driving signal PXID and a complementary driving signal PXIB.

The sub wordline driver SWD may activate the selected wordline WL in response to the driving signals PXID and PXIB and the wordline enable signal NWEIB. In this specification, the main wordline may be a wordline controlled by the wordline enable signal NWEIB, and the sub wordline may be a wordline WL controlled by the driving signals PXID and PXIB.

For example, the wordline WL corresponding to the sub wordline may share the wordline enable signal NWEIB in 4 or 8 units. The wordlines WL corresponding to the sub wordlines may be driven by the corresponding sub wordline drivers SWD.

The plurality of sub wordline drivers SWD may all have the same configuration except for input/output signals. The plurality of sub wordline drivers SWD may include a plurality of gate lines extending in a direction in which the plurality of wordlines WL extend, and a plurality of transistors implemented by a plurality of gate lines and a plurality of adjacent active regions.

In the memory device 10 according to an example embodiment, the plurality of sub wordline drivers SWD are connected to a portion of the plurality of wordlines WL, and may be designed such that another wordline WL is disposed between the connected wordlines WL. In this case, the plurality of wordlines WL may be asymmetrically disposed with respect to a boundary between two adjacent sub wordline drivers SWD. A detailed layout structure of the sub wordline driver included in the memory device 10 according to an example embodiment will be described later.

Figure 4:
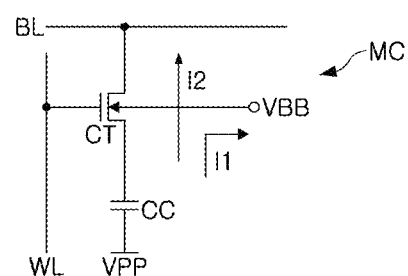
FIG. 4 is a diagram illustrating a memory cell of a memory device according to an example embodiment.

FIG. 4 is a diagram illustrating a memory cell of a memory device according to an example embodiment.

Referring to FIGS. 3 and 4, each of the sub cell arrays SCA may include a plurality of memory cells MC. The plurality of memory cells MC may be disposed at intersections of the wordline WL and the bitlines BL and BLB. Each of the plurality of memory cells MC may include a cell transistor CT and a cell capacitor CC connected to the wordline WL and the bitline BL.

On the other hand, a junction leakage current I1 may be generated due to defects in the junction boundary of the cell transistor CT, and a sub-threshold current I2 may be generated by a channel leakage current flowing through the cell transistor CT. In the memory device 10 according to an example embodiment, in the case of the memory cells MC, to reduce the junction leakage current I1 and the sub-threshold current I2, the structure of a negative voltage-biased wordline WL may be applied. For example, a back bias voltage VBB having a negative value may be applied to the unselected wordlines WL.

Figure 5:
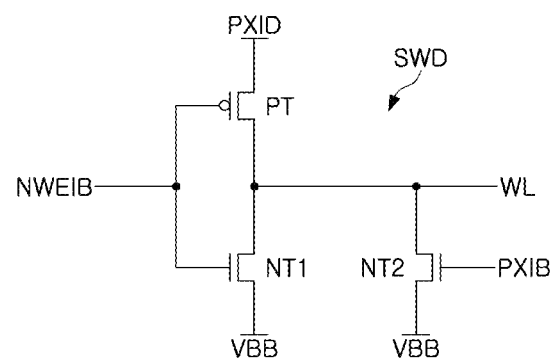
FIG. 5 is a diagram illustrating a sub wordline driver of a memory device according to an example embodiment.

FIG. 5 is a diagram illustrating a sub wordline driver of a memory device according to an example embodiment.

Referring to FIG. 5, the sub wordline driver SWD according to an example embodiment may include a PMOS transistor PT, a first NMOS transistor NT1, and a second NMOS transistor NT2.

For example, in the PMOS transistor PT, the driving signal PXID may be connected to the source terminal, the wordline enable signal NWEIB may be connected to the gate terminal, and the wordline WL may be connected to the drain terminal. The PMOS transistor PT may be a pull-up transistor, and may drive the wordline WL connected to the drain terminal in response to the wordline enable signal NWEIB and the driving signal PXID.

In the first NMOS transistor NT1, a precharge voltage corresponding to the back bias voltage VBB may be connected to the source terminal, the wordline enable signal NWEIB may be connected to the gate terminal, and the wordline WL may be connected to the drain terminal. The first NMOS transistor NT1 may be a pull-down transistor.

In the second NMOS transistor NT2, the complementary driving signal PXIB may be connected to the gate terminal, a precharge voltage corresponding to the back bias voltage VBB may be connected to the source terminal, and the wordline WL may be connected to the drain terminal. The second NMOS transistor NT2 may be a keeping transistor for maintaining the corresponding wordline WL at a ground voltage VSS level when the wordline WL is not selected. The second NMOS transistor NT2 may be connected to the first NMOS transistor NT1 in parallel.

Although the sub wordline driver SWD in FIG. 5 is illustrated as using the PMOS transistor PT as a pull-up transistor, this is only an example embodiment and the present inventive concepts are not limited thereto. For example, NMOS transistors may also be used, according to the type of the sub wordline driver SWD. On the other hand, in the case of the sub wordline driver SWD in which the second NMOS transistor NT2 is omitted, the first NMOS transistor NT1 may partially function as a keeping transistor.

Figure 6:
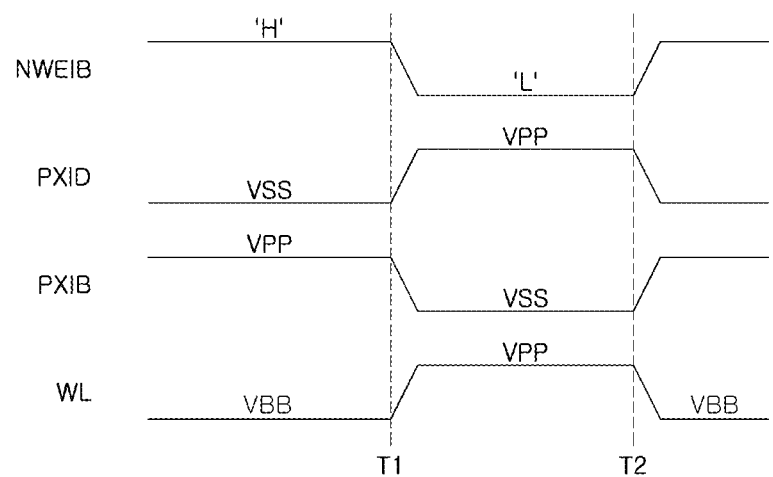
FIG. 6 is a diagram illustrating an operation of a sub wordline driver included in a memory device according to an example embodiment.

FIG. 6 is a diagram schematically illustrating an operation of a sub wordline driver included in a memory device according to an example embodiment.

Referring to FIG. 6, the sub wordline driver SWD may drive the wordline WL with the boosted voltage VPP or the back bias voltage VBB according to the wordline enable signal NWEIB.

The sub wordline driver SWD may pull up or pull down the voltage of the wordline WL according to the wordline enable signal NWEIB. For example, before a first time point T1, the wordline enable signal NWEIB may have a high (H) level that is in an inactive state, and from the first time point T1 to a second time point T2, the wordline enable signal NWEIB may have a low (L) level in an active state.

Before the first time point T1, the driving signal PXID may have a low level, for example, the ground voltage VSS, and the complementary driving signal PXIB may have a high level. When the wordline enable signal NWEIB is in an inactive state, the wordline WL may be maintained at the back bias voltage VBB. However, this is only an example and the present inventive concepts may not be limited thereto.

When the memory cell is accessed, the wordline enable signal NWEIB and the driving signal PXID corresponding to the memory cell may be activated. The sub wordline driver SWD may provide the boosted voltage VPP provided by the driving signal PXID, to the wordline WL, as the wordline enable signal NWEIB is activated to a low (L) level. Accordingly, the sub wordline driver SWD may drive the wordline WL with the boosted voltage VPP.

For example, when the wordline enable signal NWEIB is activated to a low (L) level at the first time point T1, the driving signal PXID may transition to the boosted voltage VPP, and the complementary driving signal PXIB may transition to a low level, for example, the ground voltage VSS.

Referring to FIG. 6 together with FIG. 5, at the first time point T1, the PMOS transistor PT corresponding to the pull-up transistor may be turned on, and the first NMOS transistor NT1 corresponding to the pull-down transistor may be turned off. Also, as the complementary driving signal PXIB is maintained at a low level, the second NMOS transistor NT2 corresponding to the keeping transistor may be turned off.

Accordingly, the wordline WL and the source terminal of the second NMOS transistor NT2 may be electrically cut off, and the wordline WL and the source terminal of the PMOS transistor PT may be electrically connected. In this case, the driving signal PXID having the boosted voltage VPP may be supplied to the wordline WL.

After the memory cell access operation is completed, the sub wordline driver SWD may precharge the wordline WL to the back bias voltage VBB via the ground voltage VSS. For example, the back bias voltage VBB may be defined as a precharge voltage. However, this is only an example embodiment and the present inventive concepts are not limited thereto, and the precharge voltage may have a magnitude higher than the back bias voltage VBB and lower than the ground voltage VSS.

For example, when the wordline enable signal NWEIB is inactivated to a high (H) level at the second time point T2, the driving signal PXID may transition to the ground voltage VSS level, and the complementary driving signal PXIB may transition to a high level.

At this time, as the complementary driving signal PXIB transitions to the high level, the second NMOS transistor NT2 may be turned on, and the source terminal of the second NMOS transistor NT2 may be electrically connected to the wordline WL. On the other hand, as the driving signal PXID transitions to the ground voltage VSS level, the PMOS transistor PT may be turned off, and the source terminal and the wordline WL of the PMOS transistor PT may be electrically cut off. Accordingly, the voltage of the wordline WL may drop to a precharge voltage corresponding to the back bias voltage VBB.

The second NMOS transistor NT2 included in the sub wordline driver SWD may maintain the wordline WL at a back bias voltage after the precharge operation. Accordingly, the wordline WL may maintain a stable voltage value even when the wordline enable signal NWEIB varies or causes noise.

Figure 7:
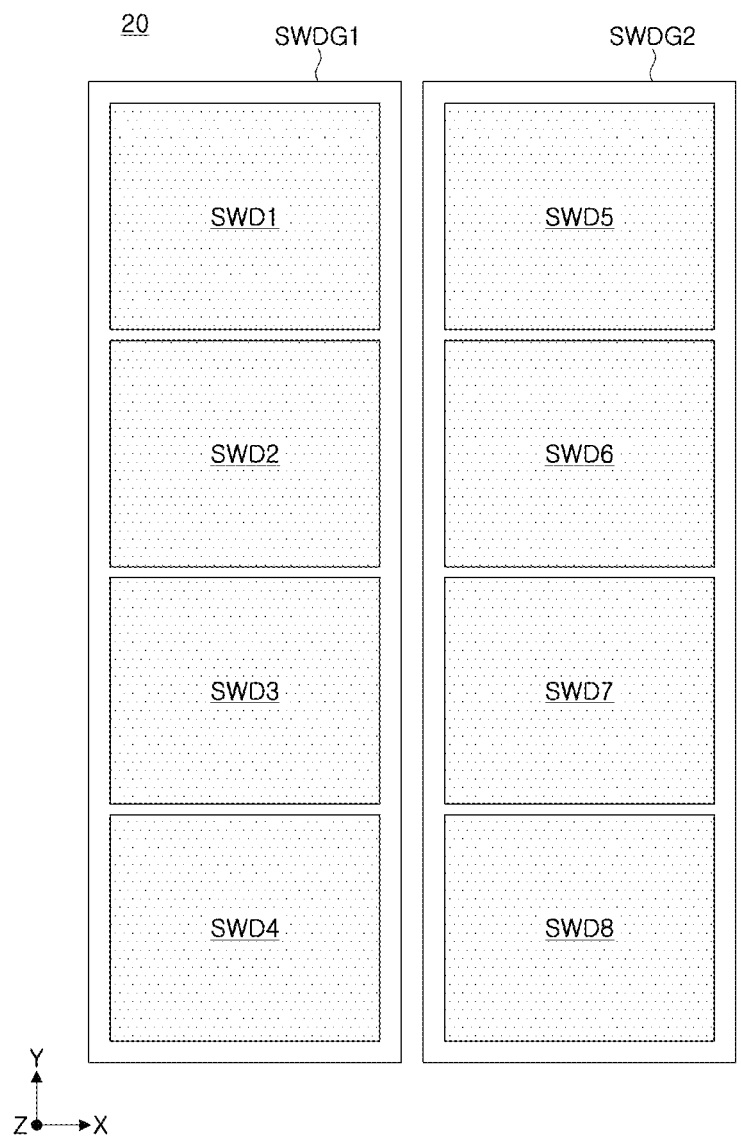
FIGS. 7 and 8 are diagrams illustrating a sub wordline driver group of a memory device according to an example embodiment.
Figure 8:
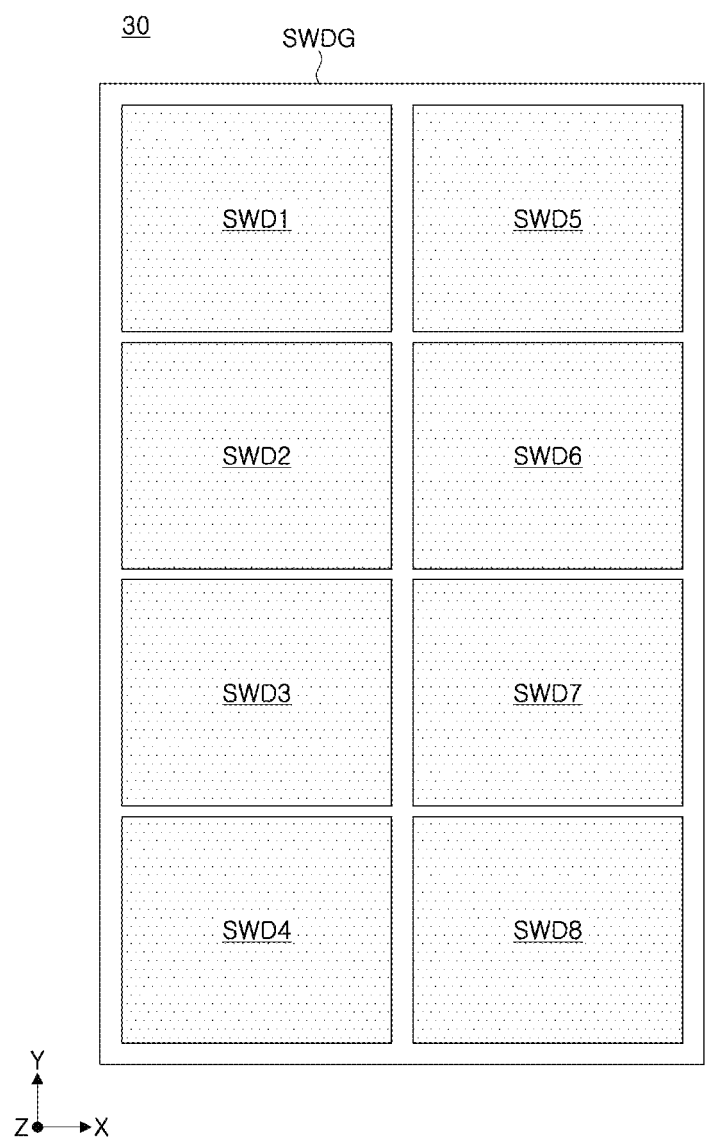

FIGS. 7 and 8 are diagrams illustrating a sub wordline driver group of a memory device according to an example embodiment.

Referring to FIGS. 2 and 7, the sub wordline driver block SWDB included in the memory device 20 may include sub wordline driver groups SWDG1 and SWDG2 in which a plurality of sub wordline drivers SWD are arranged. Although the sub wordline driver block SWDB illustrated in FIG. 7 is illustrated as including eight or more sub wordline drivers SWD1-SWD8, this is only an example and the present inventive concepts may not be limited thereto. For example, the sub wordline driver block SWDB may include eight or less sub wordline drivers SWD or may include more than eight sub wordline drivers SWD.

The sub wordline driver groups SWDG1 and SWDG2 may be a unit for performing patterning of the wordline WL on the substrate when the sub wordline drivers SWD are formed. The plurality of sub wordline drivers SWD included in each of the sub wordline driver groups SWDG1 and SWDG2 may be arranged side by side in a first direction (e.g., a Y direction) in which the wordline WL extends.

The wordlines WL corresponding to the sub wordline driver groups SWDG1 and SWDG2 may be patterned to have a mirror arrangement of each other. For example, the sub wordline drivers SWD included in each of the first sub wordline driver group SWDG1 and the second sub wordline driver group SWDG2, and the wordlines WL corresponding thereto, may be formed symmetrically in the second direction (e.g., X direction) based on the boundary between the sub wordline driver groups SWDG1 and SWDG2.

In this case, unnecessary space may be consumed between the sub wordline driver groups SWDG1 and SWDG2. On the other hand, as unnecessary space is consumed, a space in which transistors constituting the sub wordline drivers SWD may be formed may decrease. As the process of the memory device is miniaturized, the size of the components of the memory device tends to become smaller, and accordingly, the operational reliability of the sub wordline drivers SWD may not be guaranteed.

Referring to FIG. 8, the sub wordline driver block SWDB of a memory device 30 according to an example embodiment may include one sub wordline driver group SWDG in which the plurality of sub wordline drivers SWD are arranged. Similar to FIG. 7, the sub wordline driver block SWDB illustrated in FIG. 8 is illustrated as including eight or more sub wordline drivers SWD1-SWD8, but this is only an example embodiment and the present inventive concepts may not be limited thereto.

The sub wordline drivers SWD according to an example embodiment may have a repetitive arrangement such that two sub wordline drivers are disposed side by side in a first direction in which the wordline WL extends within one sub wordline driver block SWDB, and a plurality of sub wordline drivers are disposed side by side in the second direction in which the bitline BL extends.

On the other hand, two sub wordline drivers arranged above and two sub wordline drivers arranged below one sub cell array may be driven by the same wordline enable signal. For example, two sub wordline drivers (e.g., SWD1 and SWD2) arranged side by side in the first direction among the sub wordline drivers SWD may be driven by the same wordline enable signal NWEIB.

The memory device 30, according to an example embodiment, may have improved operation reliability of the sub wordline drivers SWD by varying the arrangement of the wordlines WL between the sub wordline drivers SWD disposed or positioned adjacent to each other and driven by different wordline enable signals NWEIB.

Figure 9:
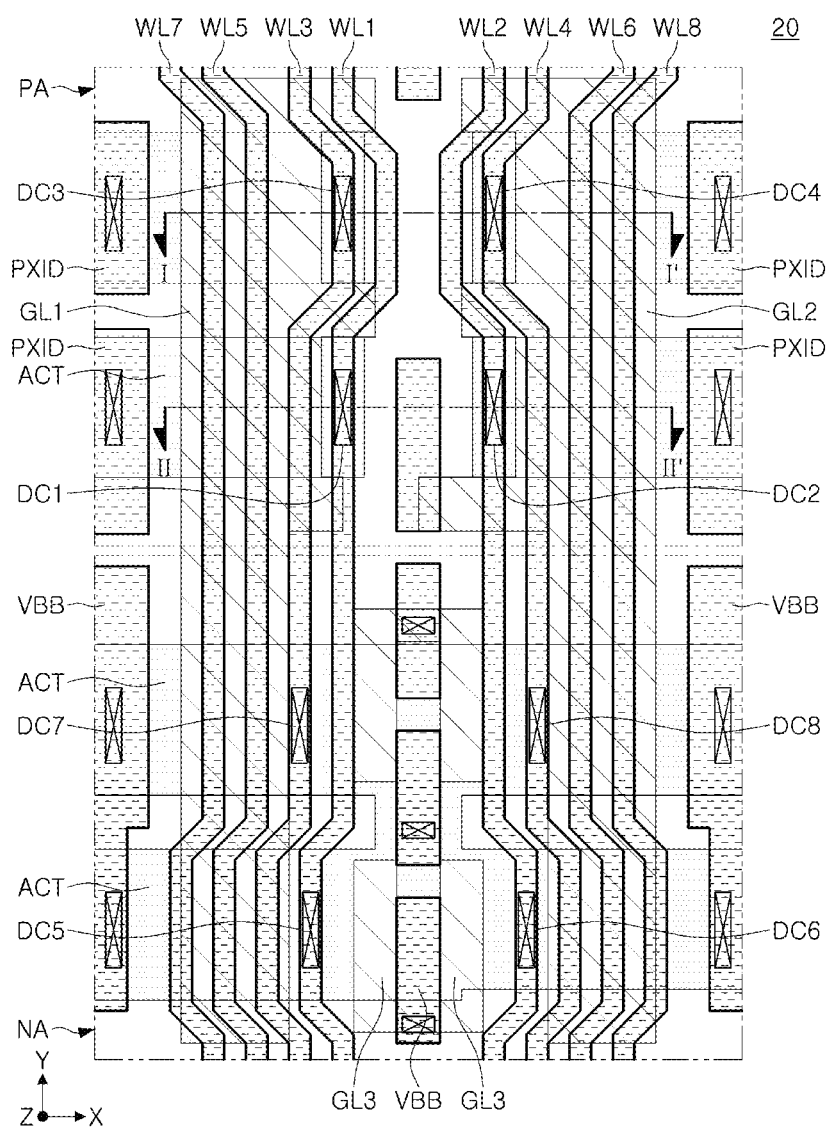
FIG. 9 is a view illustrating a layout structure of a transistor included in a sub wordline driver and a wordline connected thereto.

FIG. 9 is a diagram illustrating a layout structure of a transistor included in a sub wordline driver and a wordline connected thereto.

FIG. 9 may illustrate a layout structure of sub wordline drivers SWD1, SWD2, SWD5 and SWD6, including the layout structure of the wordlines WL1-WL8 disposed between the adjacent sub wordline drivers SWD1, SWD2, SWD5 and SWD6 illustrated in FIG. 7.

First, active regions ACT for forming a transistor of the sub wordline driver SWD may be formed on a substrate. For example, since the sub wordline driver SWD includes both a PMOS transistor and an NMOS transistor, the active regions ACT may be formed to be divided into a PMOS area PA for formation of a PMOS transistor and an NMOS area NA for formation of an NMOS transistor.

The PMOS area PA may include a plurality of bar-shaped active regions ACT that are spaced apart in a first direction (e.g., a Y direction) and extend in a second direction (e.g., an X direction). Unlike the active regions ACT of the PMOS area PA, the active region ACT of the NMOS area NA may be formed in an 'H' shape. However, this is only an example and the present inventive concepts may not be limited thereto.

The sub wordline driver SWD may include a first gate line GL1 and a second gate line GL2 that extend in the first direction and are spaced apart from each other in the second direction. The first gate line GL1 and the second gate line GL2 may be gates to which the wordline enable signal NWEIB is applied. For example, the first gate line GL1 and the second gate line GL may be formed of a gate poly.

In the NMOS area NA, third gate structures GL3 may be disposed between the first gate line GL1 and the second gate line GL2. For example, the third gate structures GL3 may be gates to which the complementary driving signal PXIB is applied.

Referring to FIG. 9 together with FIG. 5, transistors formed by the first gate line GL1 and the second gate line GL2 and the active regions ACT therearound in the PMOS area PA may be PMOS transistors PT. In addition, transistors formed by the first gate line GL1 and the second gate line GL2 and the active regions ACT therearound in the NMOS area NA may be first NMOS transistors NT1. On the other hand, transistors formed by the third gate structures GL3 and the active regions ACT therearound in the NMOS area NA may be the second NMOS transistors NT2.

In this case, the transistors formed based on the first gate line GL1 may be included in a sub wordline driver SWD different from that of the transistors formed based on the second gate line GL2. For example, based on the boundary between the first gate line GL1 and the second gate line GL2, the transistors may be formed in a symmetrical structure to correspond to each other.

On the other hand, the plurality of wordlines WL1-WL8 connected to the sub wordline drivers SWD may also be formed to have a mirror form to have a symmetrical structure based on the boundary between the first gate line GL1 and the second gate line GL2. For example, in the PMOS area PA and the NMOS area NA, in the active regions ACT between the first gate line GL1 and the second gate line GL2, a plurality of direct contacts DC1-DC8 connected to a plurality of wordlines WL1-WL8 may be disposed.

Referring to FIG. 9, the first wordline WL1 may be connected to the first direct contact DC1, and the second wordline WL2 may be connected to the second direct contact DC2. The third wordline WL3 may be connected to the third direct contact DC3, and the fourth wordline WL4 may be connected to the fourth direct contact DC4.

In this case, the first wordline WL1 and the first direct contact DC1 may correspond to the second wordline WL2 and the second direct contact DC2, and the third wordline WL3 and the third direct contact DC3 may correspond to the fourth wordline WL4 and the fourth direct contact DC4. The first to fourth direct contacts DC1 to DC4 may indicate the PMOS area, for example, in which the wordlines WL1-WL4 are connected to the drain electrode of the PMOS transistor.

Similarly, the first wordline WL1 may be connected to the fifth direct contact DC5, and the second wordline WL2 may be connected to the sixth direct contact DC6. The third wordline WL3 may be connected to the seventh direct contact DC7, and the fourth wordline WL4 may be connected to the eighth direct contact DC8.

In this case, the first wordline WL1 and the fifth direct contact DC5 may correspond to the second wordline WL2 and the sixth direct contact DC6, and the third wordline WL3 and the seventh direct contact DC7 may correspond to the fourth wordline WL4 and the eighth direct contact DC8. The fifth to eighth direct contacts DC5-DC8 may indicate the NMOS area, for example, in which the wordlines WL1-WL4 are connected to the drain electrode of the first NMOS transistor.

In the formed PMOS transistors, to the active region ACT of the opposite side in which the first to fourth direct contacts DC1 to DC4 connected to the first to fourth wordlines WL1 to WL4 are not disposed, a driving signal PXID for driving a corresponding wordline WL among the first to fourth wordlines WL1 to WL4 may be input. For example, the driving signal PXID for driving the first wordline WL1 may be applied to the direct contact disposed in the active region ACT of the opposite side to the first direct contact DC1 connecting the first wordline WL1 and the active region ACT.

Similarly, to the formed first NMOS transistors, in the active region ACT of the opposite side in which the fifth to eighth direct contacts DC5-DC8 connected to the first to fourth wordlines WL1-WL4 are not disposed, a precharge signal for precharging a corresponding wordline WL among the first to fourth wordlines WL1-WL4 may be input. For example, a back bias voltage VBB for precharging the first wordline WL1 may be applied to the direct contact disposed in the active region ACT of the opposite side to the fifth direct contact DC5 connecting the first wordline WL1 and the active region ACT.

In FIG. 9, zero or two wordlines may be disposed between the direct contacts DC1 to DC8 corresponding to each other. For example, no other wordline may be disposed between the first direct contact DC1 and the second direct contact DC2 and between the fifth direct contact DC5 and the sixth direct contact DC6, and the first wordline WL1 and the second wordline WL2 may be disposed between the third direct contact DC3 and the fourth direct contact DC4 and between the seventh direct contact DC7 and the eighth direct contact DC8.

On the other hand, in the transistors corresponding to the direct contacts DC1, DC2, DC5, and DC6 where the wordline is not disposed therebetween, three wordlines may be disposed above the gate lines GL1 and GL2. On the other hand, in transistors corresponding to the direct contacts DC3, DC4, DC7, and DC8 where two wordlines are disposed therebetween, two wordlines may be disposed above the gate lines GL1 and GL2. For example, a total of 4 or 6 wordlines may be disposed above the gate lines GL1 and GL2 of the transistors disposed side by side in the second direction.

Accordingly, a space in which at least two wordlines may be formed may need to be provided between the direct contacts DC1 to DC8 corresponding to each other. The operation reliability of the sub wordline driver SWD may be determined by the length of the gate lines GL1 and GL2 in the second direction and by the distance between the direct contacts DC1-DC8 adjacent to the gate lines GL1 and GL2. Accordingly, as the size of the sub wordline driver SWD decreases, it may be difficult to guarantee the operational reliability of the sub wordline driver SWD due to an unnecessary space in which at least two wordlines may be formed.

Figure 10A:
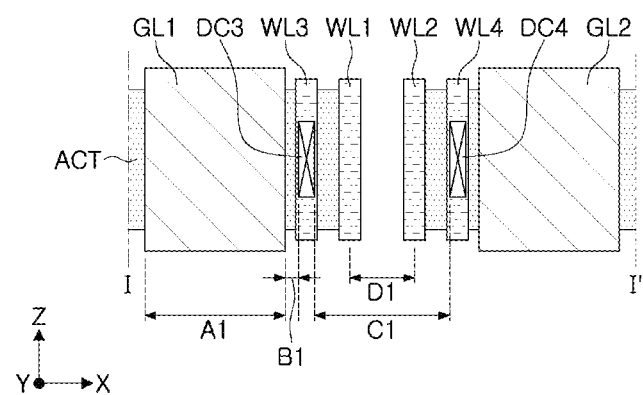
FIGS. 10A and 10B are top views illustrating the characteristics of a sub wordline driver according to the layout structure of FIG. 9.
Figure 10B:
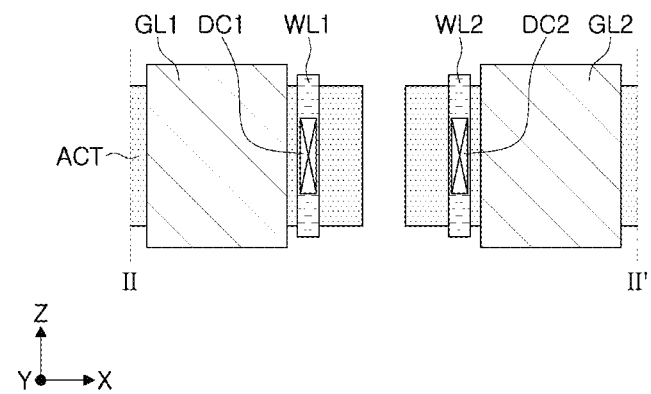
Figure 11:
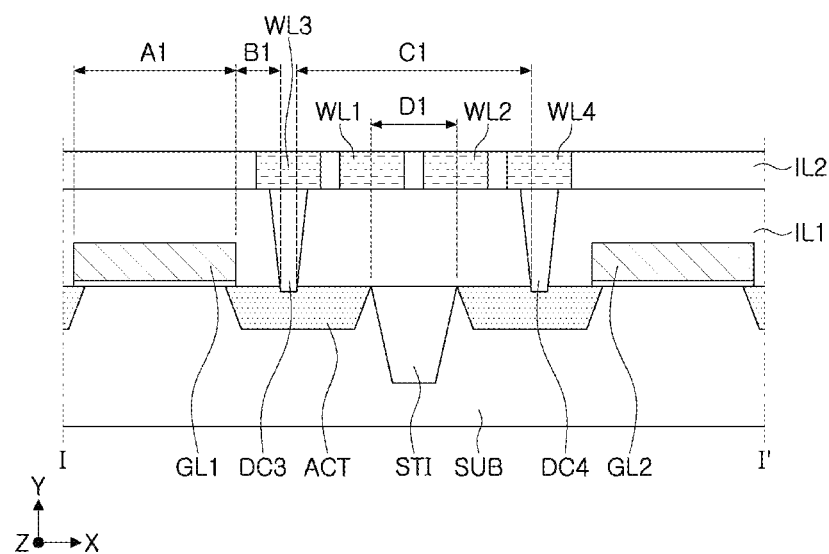
FIG. 11 is a cross-sectional view illustrating the characteristics of a sub wordline driver according to the layout structure of FIG. 9.

FIGS. 10A and 10B are top views illustrating the characteristics of a sub wordline driver according to the layout structure of FIG. 9. FIG. 11 is a cross-sectional view illustrating the characteristics of a sub wordline driver according to the layout structure of FIG. 9.

FIG. 10A may be a schematic view of the upper surface corresponding to line I-I' in the layout structure of FIG. 9, and FIG. 10B may be a schematic view of a top surface corresponding to line II-II' in the layout structure of FIG. 9. FIG. 11 may be a cross-section of line I-I' in the layout structure of FIG. 9.

Referring to FIGS. 10A and 10B, zero or two wordlines may be disposed between the direct contacts DC1 to DC4. For example, the first wordline WL1 and the second wordline WL2 may be disposed or positioned between the third direct contact DC3 and the fourth direct contact DC4. As another example, no wordline may be disposed between the first direct contact DC1 and the second direct contacts DC2.

Referring to FIG. 11, the device isolation layer STI may be formed by a shallow trench device isolation process, to define the active region ACT in which the transistor is formed on the substrate SUB. The substrate SUB may be bulk silicon or silicon-on-insulator (SOI). However, this is only an example embodiment, and the present inventive concepts may not be limited thereto. As an example, the substrate may be a silicon substrate and may include silicon germanium, Silicon Germanium on Insulator (SGOI), indium antimonide, lead tellurium compound, indium arsenide, indium phosphide, gallium arsenide or gallium antimonide.

The gate lines GL1 and GL2 may be formed on the active region ACT, and source/drain may be formed in the active region ACT on both sides of the gate lines GL1 and GL2. The direct contacts DC3 and DC4 may be formed in the drain region of the transistor.

The direct contacts DC3 and DC4 may be connected to the wordlines WL3 and WL4 corresponding thereto respectively. On the other hand, in the region illustrated in FIG. 11, the first wordline WL1 and the second wordline WL2 may be disposed between the third wordline WL3 and the fourth wordline WL4. On the other hand, in the space around the gate lines GL1 and GL2, the direct contacts DC3 and DC4, and the wordlines WL1-WL4, insulating layers IL1 and IL2 for electrical blocking from other components may be formed.

In this case, the lengths of the gate lines GL1 and GL2 in the second direction (e.g., the X direction) may have a value of A1. On the other hand, a distance between the direct contacts DC1-DC4 adjacent to the gate lines GL1 and GL2 may have a value of B1. In addition, the distance between the direct contacts DC1-DC4 corresponding to each other may have a value of C1, and the separation distance at which the active regions ACT forming different transistors are spaced apart from each other in the second direction may have a value of D1.

A1 and B1 may be values in a trade-off relationship with each other. For example, the sizes of C1 and D1 may be determined by the layout structure of the sub wordline driver, and accordingly, the sum of A1 and B1 may be determined. Therefore, when the size of A1 increases, the size of B1 may decrease, and conversely, when the size of B1 increases, the size of A1 may decrease.

The sizes of A1 and B1 may determine the operation reliability of the sub wordline driver. Therefore, if the sizes of C1 and D1 are determined, it may be difficult to improve the operation reliability of the sub wordline driver beyond a certain level.

On the other hand, even when no other wordline is disposed between the corresponding direct contacts DC1 and DC2 as illustrated in FIG. 10B, other transistors included in the corresponding sub wordline driver may have a layout structure as illustrated in FIG. 10A. Accordingly, even when another wordline is not disposed between the corresponding direct contacts DC1 and DC2, the sizes of C1 and D1 may be maintained above a certain level.

Figure 12:
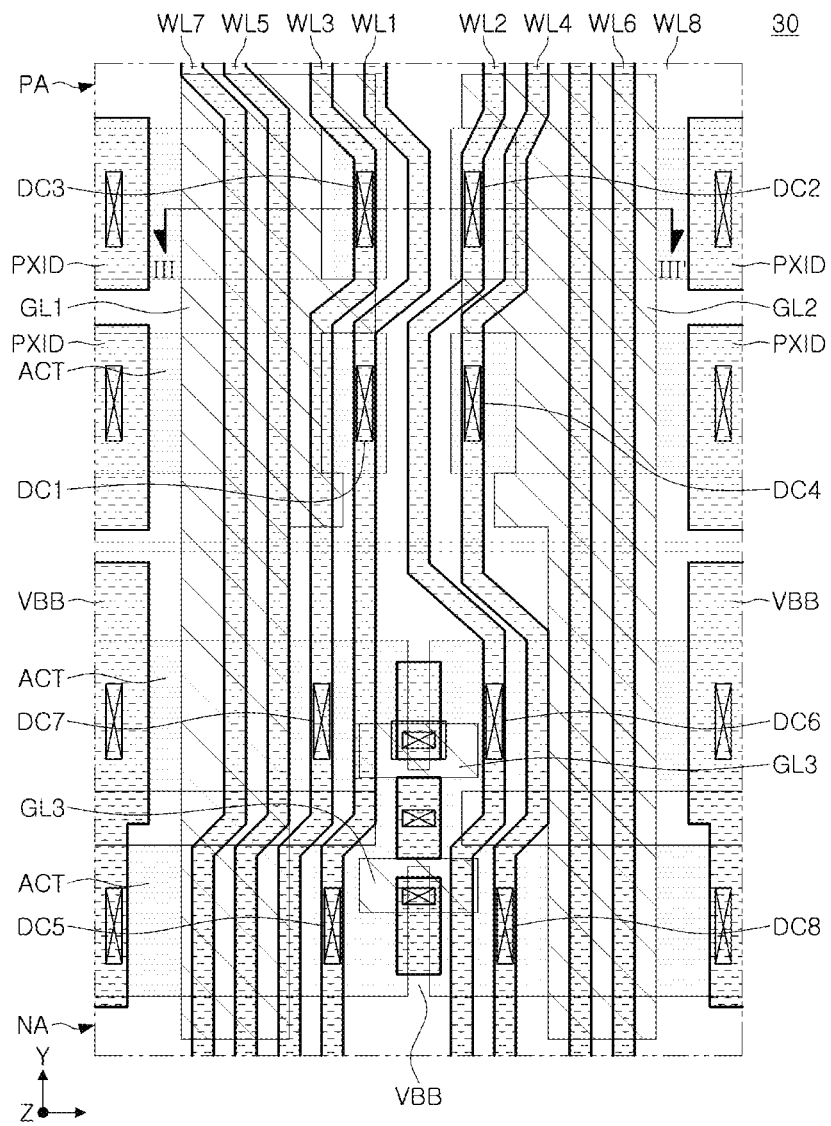
FIG. 12 is a diagram illustrating a layout structure of a transistor included in a sub wordline driver and a wordline connected thereto according to an example embodiment.

FIG. 12 is a diagram illustrating a layout structure of a transistor included in a sub wordline driver and a wordline connected thereto according to an example embodiment.

FIG. 12 illustrates the layout structure of the sub wordline drivers SWD1, SWD2, SWD5 and SWD6 including the layout structure of the wordlines WL1-WL8 disposed between the adjacent sub wordline drivers SWD1, SWD2, SWD5 and SWD6, in the memory device 30 according to the example embodiment illustrated in FIG. 8.

The layout shape of FIG. 12 may correspond to the layout shape illustrated in FIG. 9. For example, the active regions ACT where transistors of the sub wordline driver SWD are to be formed may be formed on the substrate. The active regions ACT may be divided into a PMOS area PA in which a PMOS transistor is formed, and an NMOS area NA in which an NMOS transistor is formed.

The PMOS area PA may include a plurality of bar-shaped active regions ACT that are spaced apart in a first direction (e.g., a Y direction) and extend in a second direction (e.g., an X direction). Unlike the active regions ACT of the PMOS area PA, the active region ACT of the NMOS area NA may be formed in an 'H' shape. However, this is only an example and the present inventive concepts may not be limited thereto. For example, the active region ACT of the NMOS area NA may be formed to be separated from each other between the fifth to eighth direct contacts DC5-DC8.

The sub wordline driver SWD may include a first gate line GL1 and a second gate line GL2 that extend in the first direction and are spaced apart from each other in the second direction, and third gate structures GL3 may be disposed between the first gate line GL1 and the second gate line GL2, in the NMOS area NA. For example, the first gate line GL1 and the second gate line GL2 may be gates to which the wordline enable signal NWEIB is applied, and the third gate structures GL3 may be gates to which the complementary driving signal PXIB is applied.

Referring to FIG. 12 and FIG. 5 together, the transistors formed in the PMOS area PA may be PMOS transistors PT, and the transistors formed in the NMOS area NA may be a first NMOS transistor NT1 and a second NMOS transistor NT2.

In this case, the transistors formed based on the first gate line GL1 may be included in a sub wordline driver SWD different from that of the transistors formed based on the second gate line GL2. For example, based on the boundary between the first gate line GL1 and the second gate line GL2, the transistors may be formed in a symmetrical structure to correspond to each other.

In the PMOS area PA and the NMOS area NA, in the active regions ACT between the first gate line GL1 and the second gate line GL2, a plurality of direct contacts DC1 to DC8 connected to the plurality of wordlines WL1 to WL8 may be disposed. However, the plurality of wordlines WL1-WL8 connected to the sub wordline drivers SWD according to an example embodiment of the present inventive concepts may be formed to have an asymmetrical structure with respect to a boundary between the first gate line GL1 and the second gate line GL2.

Referring to FIG. 12, the first wordline WL1 may be connected to the first direct contact DC1, and the second wordline WL2 may be connected to the second direct contact DC2. The third wordline WL3 may be connected to the third direct contact DC3, and the fourth wordline WL4 may be connected to the fourth direct contact DC4.

In this case, the first wordline WL1 and the first direct contact DC1 may correspond to the fourth wordline WL4 and the fourth direct contact DC4, and the second wordline WL2 and the second direct contact DC2 may correspond to the third wordline WL3 and the third direct contact DC3. The first to fourth direct contacts DC1 to DC4 may indicate the PMOS area, for example, in which the wordlines WL1 to WL4 are connected to the drain electrode of the PMOS transistor.

Similarly, the first wordline WL1 may be connected to the fifth direct contact DC5, and the second wordline WL2 may be connected to the sixth direct contact DC6. The third wordline WL3 may be connected to the seventh direct contact DC7, and the fourth wordline WL4 may be connected to the eighth direct contact DC8.

In this case, the first wordline WL1 and the fifth direct contact DC5 may correspond to the fourth wordline WL4 and the eighth direct contact DC8, and the second wordline WL2 and the sixth direct contact DC6 may correspond to the third wordline WL3 and the seventh direct contact DC7. The fifth to eighth direct contacts DC5-DC8 may indicate the NMOS area, for example, in which the wordlines WL1-WL4 are connected to the drain electrode of the first NMOS transistor.

Similar to the sub wordline drivers SWD illustrated in FIG. 9, in the PMOS transistors, to the active region ACT of the opposite side in which the first to fourth direct contacts DC1 to DC4 connected to the first to fourth wordlines WL1 to WL4 are not disposed, a driving signal PXID for driving a corresponding wordline WL among the first to fourth wordlines WL1 to WL4 may be input. In addition, in the first NMOS transistors, to the active region ACT of the opposite side in which the fifth to eighth direct contacts DC5-DC8 connected to the first to fourth wordlines WL1-WL4 are not disposed, a precharge signal for precharging a corresponding wordline WL among the first to fourth wordlines WL1-WL4 may be input.

In the sub wordline drivers SWD and the memory device 30 including the same according to an example embodiment, one wordline may be disposed between the direct contacts DC1 to DC8 corresponding to each other. For example, a second wordline WL2 may be disposed between the first direct contact DC1 and the fourth direct contact DC4 and between the fifth direct contact DC5 and the eighth direct contact DC8, and a first wordline WL1 may be disposed between the second direct contact DC2 and the third direct contact DC3 and between the sixth direct contact DC6 and the seventh direct contact DC7.

In this case, the wordline disposed between the direct contacts DC1 to DC8 corresponding to each other may be a wordline driven by a sub wordline driver SWD that is different from the sub wordline driver SWD including transistors formed by the active region ACT connected to the corresponding direct contacts DC1 to DC8.

In the second direction position in which the direct contacts DC1 to DC8 are disposed, the wordlines connected to the direct contacts DC1 to DC8 and the wordlines disposed therebetween may be disposed to be spaced apart from each other at a uniform distance. However, this is only an example and the present inventive concepts may not be limited thereto.

On the other hand, since one wordline is disposed between the direct contacts DC1 to DC8 corresponding to each other, two or three wordlines may be disposed above the gate lines GL1 and GL2. For example, a total of five wordlines may be disposed above the gate lines GL1 and GL2 of the transistors disposed side by side in the second direction.

Accordingly, it may be sufficient to provide only a space in which one wordline may be formed between the direct contacts DC1 to DC8 corresponding to each other. The operation reliability of the sub wordline driver SWD may be determined by the length of the gate lines GL1 and GL2 in the second direction and the distance between the direct contacts DC1-DC8 adjacent to the gate lines GL1 and GL2.

Therefore, even when the size of the sub wordline driver SWD according to an example embodiment is reduced, a margin for the length of the gate lines GL1 and GL2 in the second direction and the distance between the direct contacts DC1 to DC8 adjacent to the gate lines GL1 and GL2 may be secured. Therefore, the operation reliability of the sub wordline driver SWD may be improved.

However, the layout structure of the sub wordline drivers SWD illustrated in FIG. 12 is only an example and the present inventive concepts may not be limited thereto. For example, the arrangement of the transistors included in the sub wordline drivers SWD and the arrangement of the wordlines may be modified.

Figure 13:
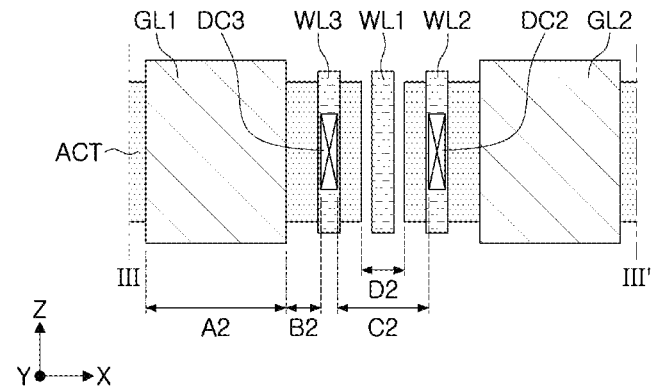
FIG. 13 is a top view illustrating the characteristics of a sub wordline driver according to an example embodiment.
Figure 14:
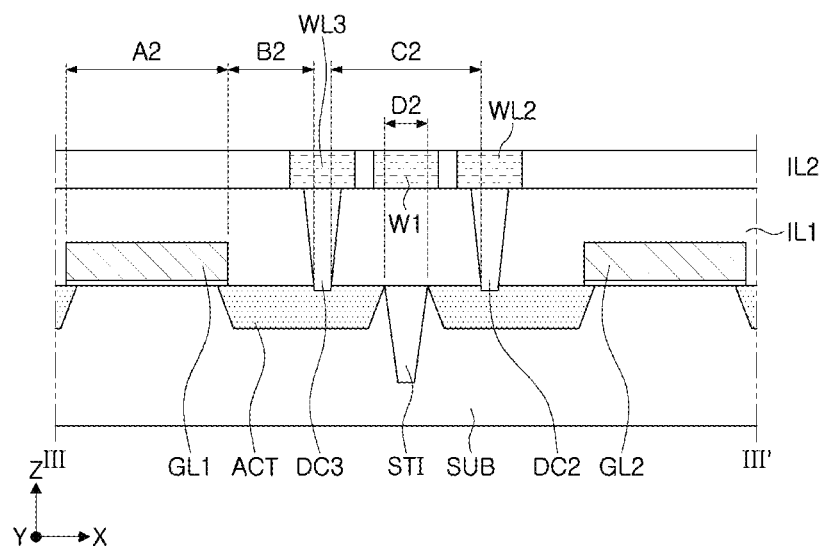
FIG. 14 is a cross-sectional view illustrating the characteristics of a sub wordline driver according to an example embodiment.

FIG. 13 is a top view illustrating the characteristics of a sub wordline driver according to an example embodiment. FIG. 14 is a cross-sectional view illustrating the characteristics of a sub wordline driver according to an example embodiment.

FIG. 13 schematically illustrates a top surface corresponding to line III-III' in the layout structure of FIG. 12, and FIG. 14 may illustrate a cross-section taken along line III-III' in the layout structure of FIG. 12.

Referring to FIGS. 13 and 14, in the memory device 30 according to an example embodiment, the device isolation layer STI may be formed by a shallow trench device isolation process to define the active region ACT in which the transistor is formed on the substrate SUB. The gate lines GL1 and GL2 may be formed on the active region ACT, and source/drain may be formed in the active region ACT on both sides of the gate lines GL1 and GL2. The direct contacts DC2 and DC3 may be formed in the drain region of the transistor.

In the sub wordline drivers SWD according to an example embodiment, the direct contacts DC2 and DC3 may be connected to the corresponding wordlines WL2 and WL3, respectively. On the other hand, in the region illustrated in FIG. 11, only the first wordline WL1 may be disposed between the second wordline WL2 and the third wordline WL3 connected to the direct contacts DC2 and DC3 corresponding to each other. On the other hand, in the space around the gate lines GL1 and GL2, the direct contacts DC2 and DC3, and the wordlines WL1-WL3, insulation layers IL1 and IL2 may be formed to block electrical connection with other components.

In this case, the lengths of the gate lines GL1 and GL2 in the second direction (e.g., the X direction) may have a value of A2. On the other hand, a distance between the direct contacts DC2 and DC3 adjacent to the gate lines GL1 and GL2 may have a value of B2. In addition, the distance between the direct contacts DC2 and DC3 corresponding to each other may have a value of C2, and the separation distance at which the active regions ACT forming different transistors are spaced apart from each other in the second direction may have a value of D2.

As described above, A2 and B2 may be values in a trade-off relationship with each other. For example, the sizes of C2 and D2 may be determined by the layout structure of the sub wordline driver, and accordingly, the sum of A2 and B2 may be determined. Accordingly, when the size of A2 increases, the size of B2 may decrease, and conversely, when the size of B2 increases, the size of A2 may decrease.

In the sub wordline drivers SWD and the memory device 30 including the same according to an example embodiment, by changing the layout structure, the size of C2 corresponding to the distance between the direct contacts DC2 and DC3 and the size of D2 corresponding to the separation distance between the active regions ACT may be reduced.

Accordingly, the sum of A2 and B2 may increase. The sizes of A2 and B2 may determine the operation reliability of the sub wordline driver. Accordingly, in the memory device 30 according to an example embodiment, the operational reliability of the sub wordline driver SWD may be secured by securing a process margin.

Figure 15:
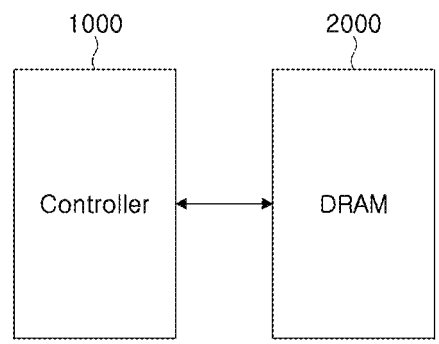
FIG. 15 is a block diagram of a memory system including a memory device according to an example embodiment.

FIG. 15 is a block diagram of a memory system including a memory device according to an example embodiment.

Referring to FIG. 15, a memory system may include a memory controller 2000 and a memory device 1000 according to an example embodiment. The memory device 1000 may be connected to the memory controller 2000 through a system bus B1, and may receive data, addresses, and commands from the memory controller 2000. Also, the memory device 1000 may provide data read from the memory cell, to the memory controller 2000 through the system bus B1.

Although not illustrated in FIG. 15, the memory controller 2000 may be connected to a host through a predetermined interface.

Figure 16:
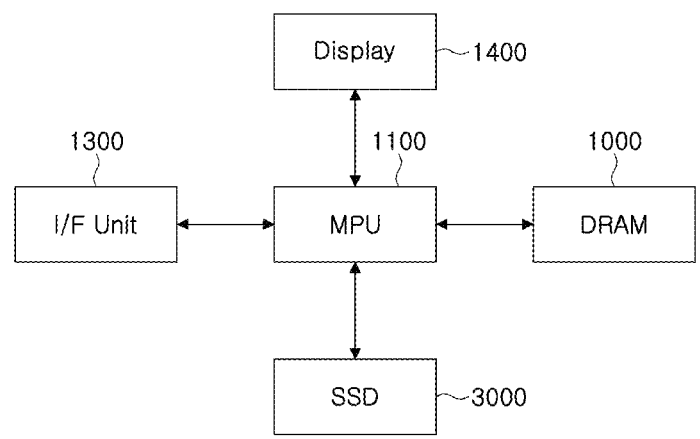
FIG. 16 is a schematic block diagram illustrating an electronic device to which a memory device according to an example embodiment is applied.

FIG. 16 is a schematic block diagram illustrating an electronic device to which a memory device according to an example embodiment is applied.

Referring to FIG. 16, an electronic device, for example, a mobile device such as a portable electronic device or a laptop computer may include a microprocessing unit (MPU) 1100, a display 1400, an interface unit 1300, a memory device 1000, and a solid state drive (SSD) 3000.

The memory device 1000 according to an example embodiment may be packaged in a single chip, together with the MPU 1100 and the SSD 3000. For example, the memory device 1000 may be embedded in an electronic device, together with the SSD 3000. However, this is only an example and the present inventive concepts may not be limited thereto. The MPU 1100 may control general operations of the electronic device according to a preset program.

On the other hand, the memory device 1000 may be connected to the MPU 1100 to function as a buffer memory or a main memory of the MPU 1100. The memory device 1000 may include a sub wordline driver having the layout illustrated in FIGS. 12 to 14.

For example, the memory device 1000 may be designed such that one wordline is disposed between direct contacts respectively connected to the transistors disposed adjacent to each other between different sub wordline drivers.

Accordingly, an electronic device to which the memory device 1000 according to an example embodiment is applied may include a sub wordline driver with improved operational reliability and/or may be manufactured in a relatively smaller size.

When the electronic device illustrated in FIG. 16 is a portable communication device, a modem and a transceiver for transmitting/receiving communication data and performing data modulation/demodulation functions may be connected to the interface unit 1300.

The display 1400 may have a touch screen as an element such as liquid crystal having a backlight, liquid crystal having an LED light source, or OLED. The display 1400 may function as an output device that displays images such as letters, numbers, and pictures in color.

The SSD 3000 may be a NOR-type or NAND-type flash memory, but is not limited thereto, and various types of non-volatile memory may be used. The non-volatile memory may store data information having various forms such as text, graphics, software code, and the like.

For example, the SSD 3000 may be implemented by electrically Erasable Programmable Read-Only Memory (EEPROM), Magnetic Random Access Memory (MRAM), Spin-Transfer Torque MRAM (STT-MRAM), Conductive Bridging RAM (CBRAM), Ferroelectric RAM (FeRAM), Phase change RAM (PRAM), Resistive RAM (RRAM), or the like.

Although the electronic device illustrated in FIG. 16 has been mainly described as a mobile communication device, some components may be added or omitted as necessary, to function for other usage. For example, the electronic device may be connected to an external communication device having a separate interface, and may further include an application chipset, CIS, mobile DRAM, and the like.

Chips forming the electronic device may be mounted using various types of packages. For example, the chips may be mounted on packages such as Package on Package (PoP), Ball Grid Arrays (BGAs), Chip Scale Packages (CSPs), System In Package (SIP), Multi Chip Package (MCP), or the like.

As set forth above, a memory device according to an example embodiment has a layout structure in which only another wordline is disposed between direct contacts respectively connected to two adjacent sub wordline drivers, and thus, the gate length and/or the distance between the gate and the direct contact may be obtained. Accordingly, a margin for improving the operational reliability of the sub wordline driver may be secured.

Additionally, control logic 12, the controller 1000, MPU 1100 and/or the components included therein may include processor(s) and/or processing circuitry such as hardware including logic circuits; a hardware/software combination such as a processor executing software; or a combination thereof. For example, the processor(s) and/or processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While example embodiments have been illustrated and described above, it will be apparent to those skilled in the art that modifications and variations could be made without departing from the scope of the present inventive concepts as defined by the appended claims.

What is claimed is:

1. A memory device comprising:
a first sub wordline driver including a first active region connected to a first wordline through a first direct contact, and a first transistor connected to a first gate line, the first gate line and the first wordline extending in a first direction; and
a second sub wordline driver including
a second active region connected to a second wordline through a second direct contact, the second direct contact and first direct contact extending in parallel in a second direction, the second direction being perpendicular to the first direction, and
a second transistor connected to a second gate line, the second gate line extending in the first direction,
wherein a third wordline driven by a third sub wordline driver is between the first wordline and the second wordline.

2. The memory device of claim 1, wherein two fourth wordlines extending in the first direction are above the first gate line in a first position of the first direct contact in the second direction, and three fifth wordlines extending in the first direction are above the second gate line.

3. The memory device of claim 1, wherein in a first position in the second direction of the first direct contact and the second direct contact the first wordline, the third wordline, and the second wordline are spaced apart from each other by a uniform interval.

4. The memory device of claim 1, wherein the first active region and the second active region are separated from each other in the second direction.

5. The memory device of claim 1, wherein the first wordline and the second wordline are in an asymmetrical structure with respect to the third wordline.

6. The memory device of claim 1, wherein transistors included in the first sub wordline driver and the second sub wordline driver, respectively, are in a symmetrical structure with respect to the third wordline.

7. The memory device of claim 1, wherein the first transistor and the second transistor are PMOS transistors.

8. The memory device of claim 7, wherein
the first transistor is configured to receive a first driving signal for driving the first wordline at a third active region opposite to the first active region, and
the second transistor is configured to receive a second driving signal for driving the second wordline, different from the first driving signal, at a fourth active region opposite to the second active region.

9. The memory device of claim 1, wherein the first transistor and the second transistor are NMOS transistors.

10. The memory device of claim 9, wherein
the first transistor is configured to receive a first precharge signal at a third active region different from the first active region, and
the second transistor is configured to receive a second precharge signal at a fourth active region different from the second active region.

11. A memory device comprising:
a first sub wordline driver including a first wordline between a first active region connected to a first direct contact and a second direct contact connected to a second active region separated from the first active region and the first direct contact, a first direction being perpendicular to a second direction; and
an adjacent transistor included in a second sub wordline driver adjacent in the second direction, the adjacent transistor configured to
activate a second wordline, and
activate a third wordline connected to the first active region through the first direct contact, in response to a wordline enable signal applied to a gate line extending in the first direction.

12. The memory device of claim 11, wherein
the first sub wordline driver includes a first NMOS transistor and a PMOS transistor,
the first NMOS transistor is configured to receive the wordline enable signal at a gate electrode of the first NMOS transistor,
a second NMOS transistor which is connected to the first NMOS transistor in parallel, and
the second NMOS transistor is configured to receive a complementary driving signal of the first wordline at a gate electrode of the second NMOS transistor.

13. The memory device of claim 12, wherein the adjacent transistor included in the second sub wordline driver includes the first NMOS transistor.

14. The memory device of claim 11, wherein in a position in the second direction of the first direct contact, at least two wordlines extending in the first direction are above the gate line.

15. The memory device of claim 11, wherein the gate line and the first direct contact are arranged such that as a distance between the gate line and the first direct contact increases, a width of the gate line in the second direction decreases.

16. A memory device comprising:
a memory cell array including a plurality of sub cell arrays; and
a plurality of sub wordline driver groups each including a plurality of sub wordline drivers corresponding to the plurality of sub cell arrays, respectively, and configured to drive a plurality of wordlines connected to the corresponding sub cell arrays,
wherein each of the plurality of sub wordline drivers included in each of the plurality of sub wordline driver groups includes a plurality of gate lines extending in a first direction and a plurality of transistors implemented by a plurality of active regions adjacent to the plurality of gate lines, the plurality of wordlines extending in the first direction, and
the plurality of transistors include a first transistor and a second transistor with respective active regions of the first transistor and the second transistor connected to a first driving wordline and a second driving wordline, respectively, through a direct contact, and one wordline of the plurality of wordlines other than the first driving wordline and the second driving wordline, the first transistor and the second transistor being positioned side by side in a second direction perpendicular to the first direction, the one wordline being between the first driving wordline and the second driving wordline.

17. The memory device of claim 16, wherein the plurality of sub wordline driver groups are each on one side of a respective sub cell array among the plurality of sub cell arrays.

18. The memory device of claim 16, wherein
each of the plurality of sub wordline drivers are connected to at least one wordline of the plurality of wordlines, and
the plurality of wordlines are positioned asymmetrically with respect to a boundary between two sub wordline drivers of the plurality of sub wordline drivers adjacent to each other in the second direction.

19. The memory device of claim 16, wherein the sub wordline drivers include the first transistor and the second transistor.

20. The memory device of claim 16, wherein the first transistor and the second transistor are configured to be controlled by different gate signals.

* * * * *